(12) United States Patent
Howarth

(10) Patent No.: US 7,005,754 B2
(45) Date of Patent: Feb. 28, 2006

(54) METHOD OF BALL GRID ARRAY (BGA) ALIGNMENT, METHOD OF TESTING, ALIGNMENT APPARATUS AND SEMICONDUCTOR DEVICE ASSEMBLY

(75) Inventor: James J. Howarth, Marsing, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 10/294,407

(22) Filed: Nov. 14, 2002

(65) Prior Publication Data

US 2003/0094707 A1 May 22, 2003

Related U.S. Application Data

(62) Division of application No. 09/944,472, filed on Aug. 30, 2001.

(51) Int. Cl.
*H01L 23/544* (2006.01)

(52) U.S. Cl. .......................... 257/797; 257/698
(58) Field of Classification Search ................ 257/797, 257/723, 724, 698, 701; 438/401, 402
See application file for complete search history.

(56) References Cited

U.S. PATENT DOCUMENTS

| | | |
|---|---|---|
| 2,752,580 A | 6/1956 | Shewmaker |
| 3,568,001 A | 3/1971 | Straus |
| 3,678,385 A | 7/1972 | Bruner |
| 3,882,807 A | 5/1975 | Montgomery |
| 3,932,934 A | 1/1976 | Lynch et al. |
| 4,066,839 A | 1/1978 | Cossutta et al. |
| 4,095,253 A | 6/1978 | Yoshimura et al. |
| 4,142,286 A | 3/1979 | Knuth et al. |
| 4,514,750 A | 4/1985 | Adams |
| 4,528,747 A | 7/1985 | Hoffman et al. |

(Continued)

FOREIGN PATENT DOCUMENTS

| | | |
|---|---|---|
| JP | 07-302860 A | 11/1955 |
| JP | 07-302860 A | 11/1995 |

OTHER PUBLICATIONS

Karl J. Puttlitz et al., *C–4/CBGA Comparison with Other MLC Single Chip Package Alternatives*, IEEE Transactions on Components, Packaging and Manufacturing Technology—Part B, vol. 18, No. 2, May 1995, pp. 250–256.

Lewis S. Goldmann, *Statistical Model for the Inherent Tilt of Flip–Chips*, Trasnsactions of the ASME, vol. 118, Mar. 1996, pp. 16–20.

Patrick J. Naslatka et al., *Determination of Optical Solder Volume for Precision Self–Alignment of BGA using Flip–Chip Bonding*, Department of Electrical and Electronic Engineering, The Hong Kong University of Science and Technology, Clear Water Bay, Kowloon, Hong Kong.

*Primary Examiner*—S. V. Clark
(74) *Attorney, Agent, or Firm*—TraskBritt, PC

(57) ABSTRACT

A method and apparatus for aligning a semiconductor device with a corresponding landing site on a carrier substrate. At least two apertures are formed in a semiconductor device, the apertures passing from a first major surface to a second, opposing major surface of the semiconductor device. Corresponding alignment features are provided on the carrier substrate at the landing site to which the semiconductor device is to be mounted. The alignment features are aligned with the corresponding apertures to effect alignment of the semiconductor device. The alignment features may include apertures corresponding in size, shape and arrangement to the semiconductor device apertures. Alignment pins may be placed through the at least two apertures to assist with alignment.

14 Claims, 4 Drawing Sheets

U.S. PATENT DOCUMENTS

| | | |
|---|---|---|
| 4,589,010 A | 5/1986 | Tateno et al. |
| 4,689,875 A | 9/1987 | Solstad |
| 4,701,781 A | 10/1987 | Sankhagowit |
| 4,722,135 A | 2/1988 | Read |
| 4,733,462 A | 3/1988 | Kawatani |
| 4,744,140 A | 5/1988 | Bright |
| 4,801,997 A | 1/1989 | Ono et al. |
| 4,810,154 A | 3/1989 | Klemmer et al. |
| 4,829,665 A * | 5/1989 | Kabeshita et al. |
| 4,841,100 A | 6/1989 | Ignasiak |
| 4,940,181 A | 7/1990 | Juskey, Jr. et al. |
| 4,958,214 A | 9/1990 | Ries et al. |
| 4,961,107 A | 10/1990 | Geist et al. |
| 4,967,262 A | 10/1990 | Farnsworth |
| 4,975,079 A | 12/1990 | Beaman et al. |
| 4,985,107 A | 1/1991 | Conroy et al. |
| 5,006,792 A | 4/1991 | Malhi et al. |
| 5,034,802 A | 7/1991 | Liebes, Jr. et al. |
| 5,051,339 A | 9/1991 | Friedrich et al. |
| 5,051,813 A | 9/1991 | Schneider et al. |
| 5,056,216 A | 10/1991 | Madou et al. |
| 5,074,036 A | 12/1991 | Dunaway et al. |
| 5,114,880 A | 5/1992 | LIn |
| 5,117,330 A | 5/1992 | Miazga |
| 5,150,194 A | 9/1992 | Brooks et al. |
| 5,155,905 A | 10/1992 | Miller, Jr. |
| 5,164,818 A | 11/1992 | Blum et al. |
| 5,189,507 A | 2/1993 | Carlomagno et al. |
| 5,203,075 A | 4/1993 | Angulas et al. |
| 5,228,862 A | 7/1993 | Baumberger et al. |
| 5,236,118 A * | 8/1993 | Bower et al. ............... 228/193 |
| 5,255,431 A | 10/1993 | Burdick |
| 5,313,015 A | 5/1994 | Hoge |
| 5,327,008 A | 7/1994 | Djennas et al. |
| 5,329,423 A | 7/1994 | Scholz |
| 5,337,219 A | 8/1994 | Carr et al. |
| 5,349,235 A | 9/1994 | Lee et al. |
| 5,349,236 A | 9/1994 | Oshino et al. |
| 5,350,713 A | 9/1994 | Liang |
| 5,352,851 A | 10/1994 | Wallace et al. |
| 5,369,550 A | 11/1994 | Kwon |
| 5,376,010 A | 12/1994 | Petersen |
| 5,378,924 A | 1/1995 | Liang |
| 5,400,220 A | 3/1995 | Swamy |
| 5,403,671 A | 4/1995 | Holzmann |
| 5,413,970 A | 5/1995 | Russell |
| 5,426,405 A | 6/1995 | Miller et al. |
| 5,435,482 A | 7/1995 | Variot et al. |
| 5,435,732 A | 7/1995 | Angulas et al. |
| 5,442,852 A | 8/1995 | Danner |
| 5,446,960 A | 9/1995 | Isaacs et al. |
| 5,453,581 A | 9/1995 | Liebman et al. |
| 5,459,287 A | 10/1995 | Swamy |
| 5,463,191 A | 10/1995 | Bell et al. |
| 5,468,991 A | 11/1995 | Lee et al. |
| 5,477,086 A | 12/1995 | Rostoker et al. |
| 5,477,933 A | 12/1995 | Nguyen |
| 5,521,427 A | 5/1996 | Chia et al. |
| 5,521,428 A | 5/1996 | Hollingsworth et al. |
| 5,526,974 A | 6/1996 | Gordon et al. |
| 5,528,461 A | 6/1996 | Gore et al. |
| 5,530,291 A | 6/1996 | Chan et al. |
| 5,530,295 A | 6/1996 | Mehr |
| 5,555,488 A | 9/1996 | McLellan et al. |
| 5,556,293 A | 9/1996 | Pfaff |
| 5,578,870 A | 11/1996 | Farnsworth et al. |
| 5,611,705 A | 3/1997 | Pfaff |
| 5,637,008 A | 6/1997 | Kozel |
| 5,637,919 A * | 6/1997 | Grabbe |
| 5,639,323 A | 6/1997 | Jordan |
| 5,643,835 A | 7/1997 | Chia et al. |
| 5,646,447 A | 7/1997 | Ramsey et al. |
| 5,669,774 A | 9/1997 | Grabbe |
| 5,688,127 A | 11/1997 | Staab et al. |
| 5,690,504 A | 11/1997 | Scanlan et al. |
| 5,691,041 A | 11/1997 | Frankeny et al. |
| 5,702,255 A | 12/1997 | Murphy et al. |
| 5,714,792 A | 2/1998 | Przano |
| 5,716,222 A | 2/1998 | Murphy |
| 5,726,502 A | 3/1998 | Beddingfield |
| 5,728,601 A | 3/1998 | Sato et al. |
| 5,730,606 A | 3/1998 | Sinclair |
| 5,751,556 A | 5/1998 | Butler et al. |
| 5,761,036 A | 6/1998 | Hopfer et al. |
| 5,766,978 A | 6/1998 | Johnson |
| 5,767,580 A | 6/1998 | Rostoker |
| 5,770,891 A | 6/1998 | Frankeny et al. |
| 5,773,321 A | 6/1998 | Ishikawa et al. |
| 5,793,618 A | 8/1998 | Chan et al. |
| 5,796,590 A | 8/1998 | Klein |
| 5,797,177 A | 8/1998 | Simmons et al. |
| 5,805,427 A | 9/1998 | Hoffman |
| 5,810,609 A | 9/1998 | Faraci et al. |
| 5,829,988 A | 11/1998 | McMillan et al. |
| 5,861,654 A * | 1/1999 | Johnson |
| 5,861,669 A | 1/1999 | Sono et al. |
| 5,887,344 A | 3/1999 | Sinclair |
| 5,892,245 A | 4/1999 | Hilton |
| 5,895,554 A | 4/1999 | Gordon |
| RE36,217 E | 6/1999 | Petersen |
| 5,924,622 A | 7/1999 | Davis et al. |
| 5,930,889 A | 8/1999 | Klein |
| 5,936,849 A | 8/1999 | Fetterman |
| 5,947,751 A | 9/1999 | Massingill |
| 5,949,137 A | 9/1999 | Domadia et al. |
| 5,955,888 A | 9/1999 | Frederickson et al. |
| 5,978,229 A | 11/1999 | Kim |
| 5,982,027 A | 11/1999 | Corisis |
| 5,983,477 A | 11/1999 | Jacks et al. |
| 5,986,885 A | 11/1999 | Wyland |
| 5,987,742 A | 11/1999 | Acciai et al. |
| 6,007,357 A | 12/1999 | Perino et al. |
| 6,018,249 A | 1/2000 | Akram et al. |
| 6,026,566 A | 2/2000 | Urban et al. |
| 6,028,350 A | 2/2000 | Sabyeying |
| 6,036,503 A | 3/2000 | Tsuchida |
| 6,037,667 A | 3/2000 | Hembree et al. |
| 6,040,618 A | 3/2000 | Akram |
| 6,042,387 A | 3/2000 | Jonaidi |
| 6,048,744 A | 4/2000 | Corsis et al. |
| 6,169,323 B1 | 1/2001 | Sakamoto |
| 6,198,172 B1 * | 3/2001 | King et al. |
| 6,242,817 B1 * | 6/2001 | Grande et al. ............... 257/797 |
| 6,297,960 B1 * | 10/2001 | Moden et al. |
| 6,333,638 B1 | 12/2001 | Fukasawa et al. |
| 6,384,360 B1 | 5/2002 | Masuo et al. |
| 6,389,688 B1 | 5/2002 | Srivastava et al. |
| 6,420,195 B1 | 7/2002 | King et al. |
| 6,518,098 B1 | 2/2003 | Corisis |
| 6,548,827 B1 * | 4/2003 | Irie |
| 6,561,836 B1 | 5/2003 | Marshall et al. |
| 6,693,674 B1 | 2/2004 | Wataya et al. |
| 2001/0046127 A1 | 11/2001 | Matsumura |

* cited by examiner

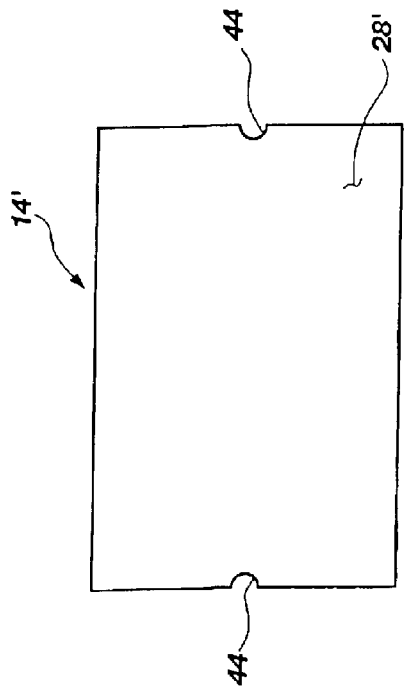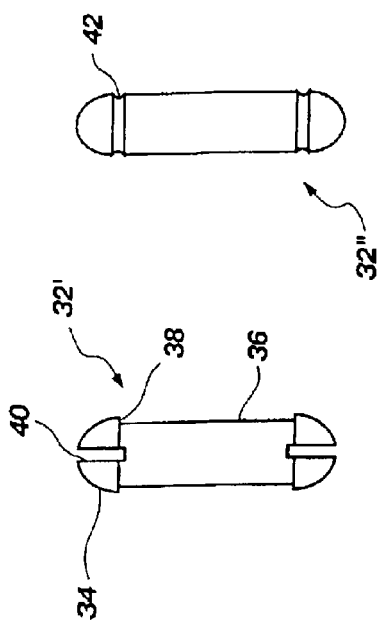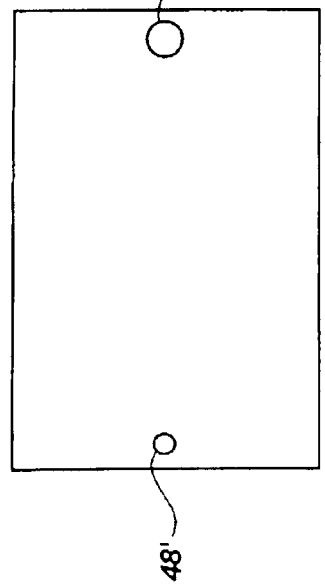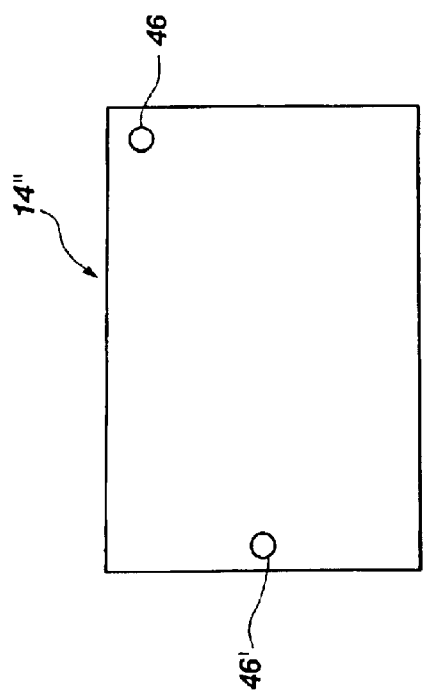

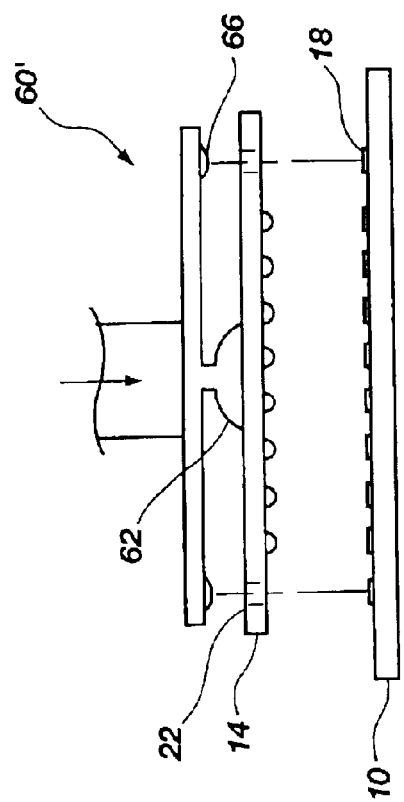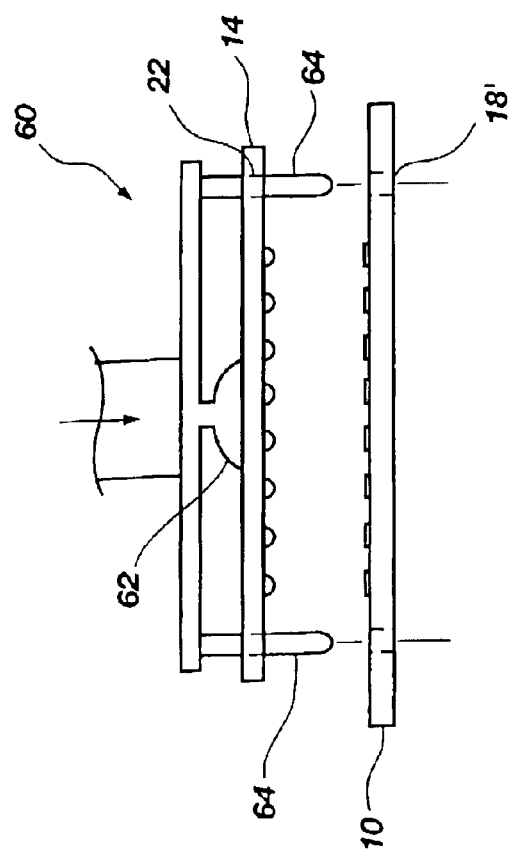
Fig. 6A
Fig. 6B

METHOD OF BALL GRID ARRAY (BGA) ALIGNMENT, METHOD OF TESTING, ALIGNMENT APPARATUS AND SEMICONDUCTOR DEVICE ASSEMBLY

CROSS-REFERENCE TO RELATED APPLICATION

This application is a divisional of application Ser. No. 09/944,472, filed Aug. 30, 2001, pending.

BACKGROUND OF THE INVENTION

1. Field of the Invention

The present invention relates generally to alignment of contacts on an electronic device with corresponding electronic contacts of a corresponding circuit on a carrier substrate. More specifically, the present invention relates to the alignment of the discrete conductive elements of a ball grid array (BGA) type semiconductor device with terminal pads of a printed circuit board or other higher-level packaging. The inventive method and apparatus are particularly suitable for testing or low-volume production.

2. State of the Art

Surface mount technology employed in semiconductor device packaging has assisted in increasing integrated circuit density on a single carrier substrate while maintaining or even increasing functionality. In an effort to further increase integrated circuit density while improving functionality, semiconductor die size continues to decrease. As semiconductor packages decrease in size, various difficulties arise in the manufacture of the packaged semiconductor die as well as its assembly with carrier substrates such as printed circuit boards.

For example, a ball grid array (BGA) is a design of semiconductor device which includes an array of discrete conductive elements in the form of conductive balls, or bumps, disposed on a surface of the semiconductor device to be mounted to a carrier substrate. The array of discrete conductive elements is aligned with a mating array of conductive terminal pads formed on the carrier substrate, such as a printed circuit board. After proper alignment, the discrete conductive elements are electrically connected to the terminal pads. If the conductive elements comprise solder balls, this step typically includes a reflow process. However, in testing situations where only a temporary connection is required, simple contact of the conductive balls with the terminal pads may be sufficient. Proper alignment is crucial to effecting electrical contact. If the BGA device is misaligned with respect to the carrier substrate and terminal pads, one or more of the discrete conductive elements of the array may not make sufficient contact with the corresponding terminals pad(s). This, of course, may result in an inoperative circuit.

As BGA semiconductor devices are developed into smaller packages such as, for example, fine pitch BGAs, the size of the conductive balls is reduced. Likewise, the pitch, or the lateral spacing between adjacent conductive balls, also decreases. The reduction of ball size and pitch requires greater accuracy and tighter tolerances during manufacturing. Similarly, alignment of a BGA semiconductor device with the carrier substrate becomes increasingly difficult. Accurate alignment is conventionally accomplished with expensive, automated pick and place equipment which requires extensive programming.

Such automated pick and place equipment requires independent set up and programming depending on the type of semiconductor device being aligned and assembled. Various parameters are required for programming and operation, such as the size of the semiconductor device, location of the semiconductor device with respect to the carrier substrate and semiconductor device orientation with respect to the carrier substrate. Different alignment techniques may be employed depending on the type of semiconductor device as well. For example, alignment techniques may differ based on whether the device is a BGA, a thin small outline package (TSOP), a quad flat pack (QFP) or some other type of device. A TSOP, QFP and other similar semiconductor devices typically include conductive elements in the form of leads disposed around a portion or all of the periphery of the semiconductor device while a BGA semiconductor device, on the other hand, carries the discrete conductive elements on a major surface of a semiconductor die or interposer substrate. The ability to align a semiconductor device having visible leads, such as with a TSOP or QFP, may be accomplished using optical or sight techniques looking down on the device and carrier substrate from above. However, this ability is greatly diminished, if available at all, when aligning discrete conductive elements on a BGA semiconductor device with the corresponding, terminal-facing pads of a carrier substrate, since it would be necessary to view the array of discrete conductive elements and the terminal pads, retain such alignment in computer memory and then calculate correct alignment.

Alignment concerns are increased when the assembly or testing process is to be low-volume production. For example in rework, in various testing procedures, or in custom or small build projects, it is not always practical to expend the resources in programming and setting up automated equipment to assemble relatively few components. Thus, alignment may be performed partially or wholly as a manual operation. Manual alignment of such assemblies is difficult and time consuming at best, particularly when alignment is further complicated by an inability to utilize optical or sight alignment techniques.

Attempts to remedy such alignment difficulties have not proven to achieve complete success. For example, one solution to aligning a BGA semiconductor device with mating terminal pads of a carrier substrate has been to form mating cavities in a surface of the carrier substrate, wherein the terminal pads are formed in the mating cavities. Each individual cavity is configured to receive one of the discrete conductive elements of the BGA semiconductor device to effect self alignment of the semiconductor device. While such an approach attempts to remedy alignment difficulties where optical or sight processes are difficult if not impossible to employ, the described approach is problematic in that it relies on the accuracy of forming properly dimensioned and located discrete conductive elements on the BGA semiconductor device. Also, as with other techniques, it still fails to allow for visual or optical assistance in effecting or confirming alignment of discrete conductive elements of the semiconductor device with the carrier substrate.

In view of the shortcomings in the state of the art, it would be advantageous to provide a method of aligning BGA or other arrayed discrete conductive element-type semiconductor devices with corresponding carrier substrates or other higher-level packaging for attachment. Such attachment may be either permanent or temporary.

It would also be advantageous to provide a method of alignment, as well as an apparatus for performing such alignment which may be employed either manually or in conjunction with automated pick and place equipment. In the case of utilizing the method or apparatus in conjunction with automated equipment, it should be capable of easy implementation, without incurring excessive set up time or operational expense.

BRIEF SUMMARY OF THE INVENTION

One aspect of the invention comprises a method for aligning a semiconductor device package with a carrier substrate such as a printed circuit board. The method includes forming at least two apertures through the semiconductor device. The apertures pass from a first major surface of the semiconductor device to a second, opposing major surface of semiconductor device. The carrier substrate is provided with at least two alignment features, each alignment feature respectively corresponding with one of the apertures of the semiconductor device. The semiconductor device is placed over the carrier substrate and each alignment feature is aligned with its corresponding aperture formed through the semiconductor device.

Another aspect of the invention includes a method of testing a semiconductor device having a plurality of discrete conductive elements projecting from a major surface thereof. A carrier substrate is provided having a plurality of terminal pads arranged in a pattern to mate with the plurality of discrete conductive elements. At least two apertures are formed in the semiconductor device, each aperture passing from a first major surface to a second, opposing major surface of the semiconductor device. The carrier substrate is provided with at least two alignment features, each alignment feature respectively corresponding to one of the at least two apertures in the semiconductor device. The semiconductor device is placed over the carrier substrate with each of the apertures in the semiconductor device being aligned with its corresponding alignment feature on the carrier substrate. Each discrete conductive element is placed in electrical contact with a corresponding terminal pad and electrical test signals are passed between the semiconductor device and carrier substrate via the terminal pads of the carrier substrate.

The alignment features may include corresponding apertures formed in the carrier substrate. In such a case, a pin may be placed through each aperture of the semiconductor device and into each aperture formed in the carrier substrate. Such pins may be nonconductive and may also serve as a means of fastening the semiconductor device to the carrier substrate for either permanent or temporary assembly.

The semiconductor device may be held in place during testing by having the ends of the pins configured to form a mechanical locking mechanism such that insertion of the pins through the apertures of the semiconductor device and carrier substrate both aligns the semiconductor device and retains the semiconductor device on the carrier substrate until testing is completed. After testing is completed, the pins may be cut or otherwise removed such that the semiconductor device may be removed from the carrier substrate for further testing, processing or packaging.

In accordance with another aspect of the invention, an alignment tool is provided. The alignment tool includes a holding mechanism such as, for example, a vacuum quill on an alignment head configured for placement against a surface of a semiconductor device. Alternatively, the alignment head may employ a plurality of fingers which grasps the semiconductor device by its periphery. In addition to the holding mechanism, an alignment mechanism is incorporated into the alignment head. For example, in one embodiment, at least two locating pins, adjacent the holding mechanism, are affixed to the alignment head. The locating pins are sized and positioned to be inserted through at least two corresponding apertures formed in the semiconductor device and into at least two corresponding apertures in a carrier substrate. The alignment tool may be configured for manual use or for use with an automated pick-and-place device. The operator may use the alignment tool to align the semiconductor device with the carrier substrate by both sight and touch as the pins are inserted into the appropriate apertures.

In another embodiment, the alignment head may include an optical instrument, such as a light-emitting device located to provide light through at least two apertures of a semiconductor device. The optical instrument may then be used to detect alignment features such as optical fiducial marks formed of a reflective coating and placed on the surface of the carrier substrate. The light-emitting device passes light through the at least two apertures and, upon proper alignment of the semiconductor device with the carrier substrate, the light will be reflected from the optical fiducial marks. The reflected light is then detected and registered to indicate that the semiconductor device is properly placed over the carrier substrate for mounting.

BRIEF DESCRIPTION OF THE SEVERAL VIEWS OF THE DRAWINGS

The foregoing and other advantages of the invention will become apparent upon reading the following detailed description and upon reference to the drawings in which:

FIGS. 4A and 4B depict aligning pins according to another embodiment of the present invention;

FIGS. 5A, 5B, and 5C are plan views of various semiconductor devices according to additional embodiments of the present invention; and FIGS. 6A and 6B show alignment tools utilized in conjunction with aligning a semiconductor device and a carrier substrate according to further embodiments of the present invention.

DETAILED DESCRIPTION OF THE INVENTION

Figure 1:
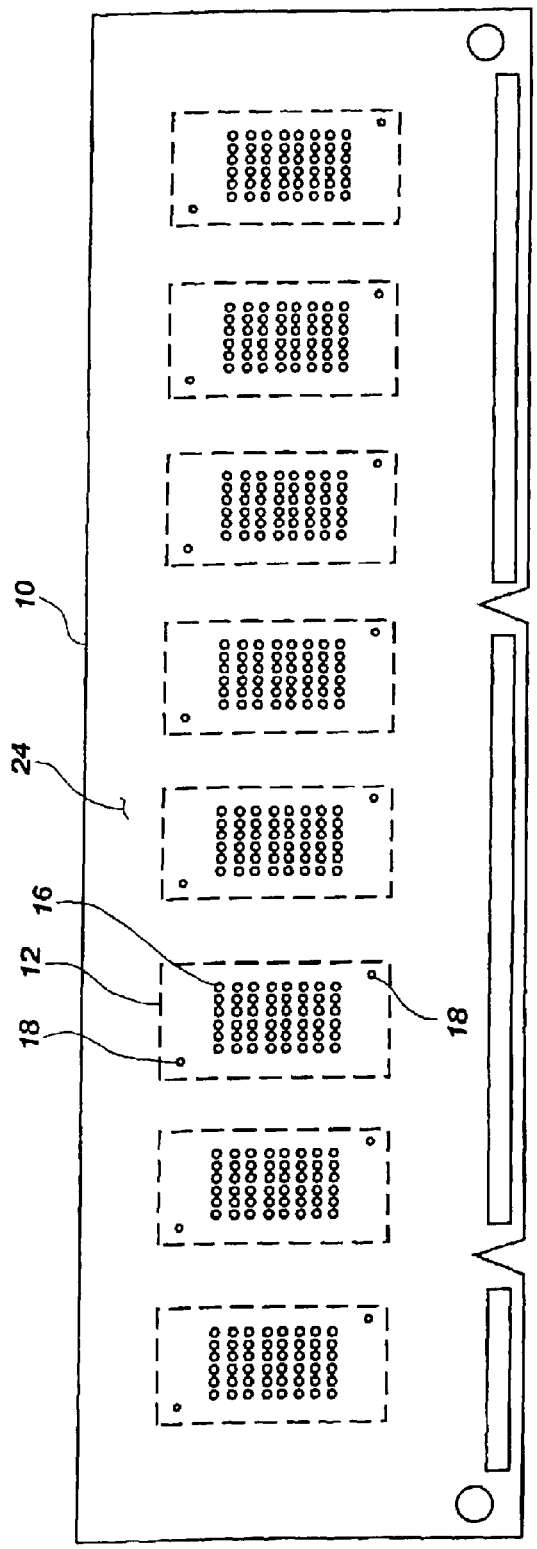
FIG. 1 is a plan view of the mounting surface of a printed circuit board for a multi-chip module (MCM) according to one embodiment of the present invention.
Figure 2:
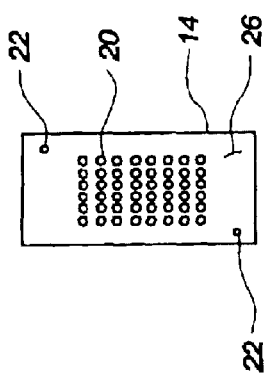
FIG. 2 is a plan view of the mounting surface of a semiconductor device according to one embodiment of the present invention.

Referring to FIGS. 1 and 2, a carrier substrate is shown in the form of a printed circuit board 10 for a multi-chip module (MCM). The printed circuit board 10 has multiple landing sites 12, each matched to the footprint of a semiconductor device 14 to be mounted thereon. Each landing site 12 includes an array of conductive terminal pads 16 as well as a pair of alignment features 18. The terminal pads 16 are formed in association with conductive traces of the printed circuit board 10 and are arranged in a pattern to mate with a plurality of discrete conductive elements 20 located on and projecting from a major surface of the semiconductor device 14. The semiconductor device 14 depicted in FIG. 2 shows a BGA-type semiconductor device wherein the discrete conductive elements 20 comprise an array of conductive bumps formed of solder or another conductive material such as a conductive epoxy or conductor-filled epoxy and located on a major surface of the semiconductor device 14. A pair of apertures 22 is formed in the semiconductor device 14 and is located such that the pair of apertures 22 will correspond with the pair of alignment features 18 found on the printed circuit board 10 during assembly of the semiconductor device 14 with the printed circuit board 10 when the former is placed in proper alignment over the latter.

The apertures 22 comprise small channels or passages, for example, 30 mils in diameter, formed through the package of semiconductor device 14 at locations where they will not interfere with the internal circuitry of the semiconductor device 14. FIG. 2 shows the apertures 22 to be located on a diagonal at opposite corners of the semiconductor device 14. The location and size of the apertures 22 may, and likely will, vary depending on the specific semiconductor device 14 being mounted and the specific printed circuit board 10 to which the semiconductor device will be mounted. The apertures 22 may be formed during the fabrication of the semiconductor device 14 as an integral feature of the semiconductor device or packaging thereof. However, in using mass-produced semiconductor devices for small build projects, or in rework processes, it may be more desirable to form the apertures 22 after manufacture of the semiconductor device 14 using a simple technique such as drilling or burning. Such a process might be performed easily and accurately using conventional numerically controlled (NC) or computer numerically controlled (CNC) machinery, as is commonly understood by those of ordinary skill in the art.

It is noted that in viewing FIGS. 1 and 2, the alignment features 18 and the apertures 22 appear to be placed on opposite diagonals. However, it is noted that the views shown in FIGS. 1 and 2 represent the respective major surfaces 24 and 26 of the printed circuit board 10 and the semiconductor device 14 which will be mutually facing when semiconductor device 14 is mounted to printed circuit board 10. Thus, as the semiconductor device 14 is rotated over such that the discrete conductive elements 20 may make contact with the terminal pads 16, the apertures 22 reverse their relative locations and are positioned along the same diagonal as the alignment features 18 on printed circuit board 10.

Figure 3:
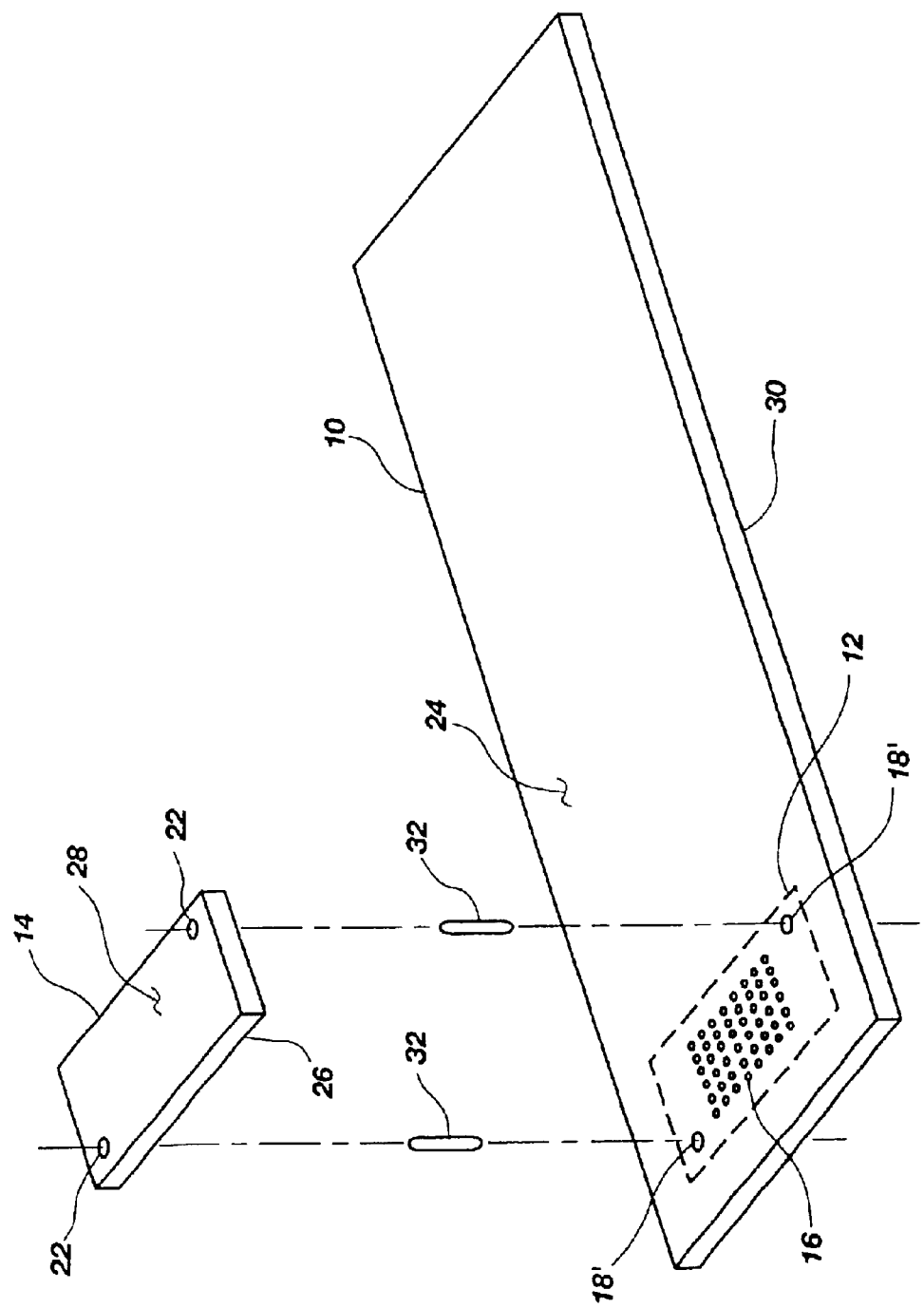
FIG. 3 is a perspective view depicting an alignment technique according to one embodiment of the present invention.

Referring to FIG. 3, a perspective view shows the semiconductor device 14 being assembled to the printed circuit board 10 according to one embodiment of the present invention. The alignment features of the printed circuit board 10 of the presently disclosed embodiment include a set of holes 18', or channels, similar to those formed in the semiconductor device 14. While these holes 18' formed in the printed circuit board 10 are of a size and shape similar to the apertures 22 formed in the semiconductor device 14, they will be referred to as holes 18' for purposes of differentiating them from the apertures 22. Also, it is noted that the apertures 22 are formed through the semiconductor device 14, passing from the mounting surface 26 to the non-mounting surface 28, creating open passages through the device. On the other hand, the holes 18' in the printed circuit board 10 may be blind holes, or may be through holes passing from the mounting surface 24 of printed circuit board 10 to the non-mounting surface 30 thereof.

To align the semiconductor device 14 with the printed circuit board 10 such that discrete conductive elements 20 of the semiconductor device 14 appropriately interface with corresponding terminal pads 16, locating pins 32 are placed in the holes 18' of the printed circuit board 10 and in the apertures 22 of the semiconductor device 14. The locating pins 32 are appropriately sized to fit in the holes 18' and apertures 22 and may be formed such that a press fit-type connection is formed upon insertion of the locating pins 32. Prior to assembly of the semiconductor device 14 to the printed circuit board 10, the locating pins 32 maybe placed into either the holes 18' or the apertures 22. However, in such a method of assembly, it is preferable that the locating pins 32 be placed into holes 18' of the printed circuit board 10 such that the locating pins 32 may be sighted through the apertures 22 of the semiconductor device 14 during an alignment and assembly operation. Alternatively, the semiconductor device 14 may be placed on the printed circuit board 10 and roughly aligned by sighting through the apertures 22 to the holes 18'. Actual alignment of semiconductor device 14 to printed circuit board 10 would then be effected by subsequently placing the locating pins 32 through both apertures 22 and holes 18'.

After alignment has been effected and the locating pins 32 are in the holes 18' and the apertures 22, subsequent operations may take place depending on the purpose of assembling the semiconductor device 14 with the printed circuit board 10. For example, with the locating pins 32 in place and after proper alignment, the semiconductor device 14 may be tested by passing electrical signals between the semiconductor device 14 and the printed circuit board 10 via the terminal pads 16 and mating discrete conductive elements 20. Another example would be to permanently attach the semiconductor device 14 to the printed circuit board 10 by permanently securing each discrete conductive element 20 to its corresponding terminal pad 16 by techniques well known in the art which depend on the composition of discrete conductive elements 20. It is also possible that the semiconductor device 14 be temporarily attached to the printed circuit board 10 by mechanical means which shall be discussed in greater detail below. Temporary assembly may be desirable in small custom projects as well as in situations where handling of the assembled module was to take place in between multiple tests of the semiconductor devices 14 mounted thereto.

As noted above, the locating pins 32 should be manufactured to mate with the holes 18' and apertures 22. Thus, as the size or shape of the holes 18' and apertures 22 may change from one assembly to another, so should the size or shape of the locating pins 32. It is preferable that the locating pins 32 be manufactured from a nonconductive, antistatic material such as an appropriate polymer material. The use of an antistatic material reduces the chance of static discharge damaging the semiconductor device 14 while use of a nonconductive material helps to avoid any interference with the electrical signals passing through the semiconductor device 14 or printed circuit board 10.

Various embodiments of the locating pins 32 may be utilized if it is desired that semi-permanent assembly be effected. For example, locating pins 32 as depicted in FIG. 3 may be made from a thermoplastic or thermosetting material to enable thermal bonding of the locating pins 32 to the printed circuit board 10 and/or to the semiconductor device 14. Alternatively, FIGS. 4A and 4B show locating pins 32' and 32" respectively, which are configured to enable mechanical locking of the semiconductor device 14 to the printed circuit board 10.

FIG. 4A depicts a pin 32' having a locking head 34 at each end thereof. The locking head 34 includes a region which is slightly enlarged with respect to the shank 36 of the pin 32', resulting in a slight shoulder 38 proximate each end. The locking head 34 has a cut or a slit 40 in it allowing the locking head 34 to compress slightly as it is passed through the aperture 22 or hole 18'. After the pin 32' has been properly inserted, the locking heads 34 will expand and shoulders 38 will retain a predetermined amount of pressure upon the non-mounting surfaces 28 and 30 of the semiconductor device 14 and printed circuit board 10, respectively, to maintain the components in alignment.

Alternatively, FIG. 4B shows a pin 32" with circumferential grooves 42 formed proximate each end thereof. In conjunction with installing pin 32" into the apertures 22 and holes 18', a c-clip or other retaining clip (not shown) may be received by each groove 42 after the pin 32" has passed through a hole 18' at one end thereof and an aperture 22 at the other end thereof. The retaining clips would then supply the requisite holding force to maintain the integrity of the assembly of the semiconductor device 14 and printed circuit board 10. Other, similar locking retaining mechanisms may be employed to accomplish the same purpose. Of course, various combinations of the above-described attaching methods and mechanisms may be used. For example, one end of a pin 32 may be thermally bonded in the holes 18' of the printed circuit board 10 while the opposite end of the pin 32 may include a mechanical fastening device. Also, it is contemplated that the pin 32 may be integrally formed with the printed circuit board 10 as the corresponding alignment features 18.

Just as the locating pins 32 may be utilized according to various embodiments, various sizes, shapes and arrangements of the apertures 22 (and thus the corresponding alignment features 18) may be utilized. FIGS. 5A, 5B and 5C depict some examples of different embodiments which may be used. FIG. 5A shows a semiconductor device 14' wherein notch-shaped channels 44 are formed at the periphery of the semiconductor device 14'. It is noted that the channels 44 are shown to have a semicircular shape as shown in this view. Other shapes, such as a simple notched "V," may also be sufficient. The channels 44 still pass from the non—mounting side 28' to the mounting side (not shown) of semiconductor device 14'. FIG. 5B shows a semiconductor device 14" where the channels 46 and 46' are arranged asymmetrically with respect to the geographical outline of the semiconductor device 14" to facilitate proper rotational alignment of components. FIG. 5C depicts a semiconductor device 14''' having a channel of a first size 48 and a channel of a second size 48' to facilitate proper rotational alignment of components. Thus, the embodiments shown in FIGS. 5B and 5C not only facilitate proper alignment of the semiconductor device with the printed circuit board, but also ensure proper orientation of a semiconductor device with respect to the printed circuit board. Of course, in utilizing any of the embodiments described above, the alignment features 18 of the printed circuit board 10 are formed to correspond to the size, shape or arrangement of the apertures or channels of the semiconductor device. It is also noted that variations and combinations of the above-described embodiments are contemplated as being within the scope of the invention. As an example, channels of different sizes may be arranged asymmetrically, or along the periphery.

Referring now to FIGS. 6A and 6B, placement tools 60 and 60' are respectively shown for assisting alignment of a semiconductor device 14 with a printed circuit board 10 in accordance with the technique described above. FIG. 6A shows a holding mechanism in the form of a suction device 62 selectively connected to a vacuum source (not shown), which may be cup-shaped as shown or configured as a vacuum quill, for grasping and holding the semiconductor device 14. Alternatively, the holding mechanism may comprise a plurality of fingers or similar elements for grasping the semiconductor device about its periphery. In addition to the suction device 62, a pair of alignment pins 64 is located adjacent the suction device 62 and corresponds in size, shape and position with the apertures 22 formed in the semiconductor device 14. Because, as disclosed above, the apertures 22 correspond with the holes 18' of the printed circuit board 10, the alignment pins 64 will also correspond with the holes 18'. Thus, as the pins 64 are placed through the holes 18' of the printed circuit board 10, after being received in apertures 22, alignment of the semiconductor device 14 and printed circuit board 10 is effected. Subsequent to proper alignment and attachment of the semiconductor device 14 with the printed circuit board 10, whether temporary or permanent, the suction device 62 may be released and the tool 60 removed, including the alignment pins 64. Alternatively, the tool 60 may be constructed such that the pins are releasable from placement tool 60 and remain with the assembled semiconductor device 14 and printed circuit board 10 and are replaced with respect to the tool 60 each time a semiconductor device 14 is placed on a printed circuit board 10.

FIG. 6B shows a method of using a placement tool 60' wherein the tool 60' does not utilize any alignment pins. Rather, the tool 60' allows access for sighting through the apertures 22 of the semiconductor device 14 to confirm alignment of the apertures 22 with corresponding alignment features 18 provided on the printed circuit board 10. In regard to this embodiment, the alignment features 18 need not be holes as discussed above but, instead, may be an alignment marking that is viewable through the apertures 22. For example, reflective markings may be placed at appropriate locations on the mounting surface 24 of the printed circuit board 10 such that reflection of light by the alignment features 18 may be recognized by an optical instrument 66 or by an operator. In this regard, a light-emitting diode (LED) mounted on an alignment tool may be used as a downwardly directed light source and the reflection thereof from markings comprising alignment features 18 detected by a photocell. When using an optical instrument 66 to recognize the reflection, thus effecting alignment, the optical instrument 66 may be integrated into the alignment tool 60' as depicted in FIG. 6B.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A semiconductor device assembly, comprising:

at least one semiconductor device package having a plurality of conductors extending from a first exposed surface of the at least one semiconductor device package and at least two apertures extending from the first surface to a second, opposing exposed surface of the at least one semiconductor device package;

a carrier substrate having at least two alignment features thereon spaced and positioned in correspondence to spacing and positioning of the at least two apertures, the at least one semiconductor device package superimposed over the carrier substrate with the at least two apertures aligned with the at least two alignment features, wherein the carrier substrate includes a plurality of terminal pads located and configured to correspond with the plurality of conductors when the at least two apertures are aligned with the at least two alignment features; and structure securing the at least one semiconductor device package to the carrier substrate comprising pins inserted through the at least two apertures and secured to the carrier substrate, wherein each of the pins includes at least one mechanical locking feature located adjacent an end thereof.

2. The semiconductor device assembly of claim 1, wherein the at least two alignment features comprise holes, and the pins are received in the holes.

3. The semiconductor device assembly of claim 2, wherein the pins are thermally bonded to the carrier substrate.

4. The semiconductor device assembly of claim 1, wherein the pins are thermally bonded to the at least one semiconductor device package.

5. The semiconductor device assembly of claim 1, wherein each of the pins further includes at least one mechanical locking feature located adjacent an end thereof.

6. A semiconductor device assembly, comprising:
at least one semiconductor device package having a plurality of conductors extending from a first exposed surface of the at least one semiconductor device package and at least two apertures extending from the first surface to a second, opposing exposed surface of the at least one semiconductor device package;
a carrier substrate having at least two alignment features thereon spaced and positioned in correspondence to spacing and positioning of the at least two apertures, the at least one semiconductor device package superimposed over the carrier substrate with the at least two apertures aligned with the at least two alignment features; and
structure securing the at least one semiconductor device package to the carrier substrate comprising pins inserted through the at least two apertures and secured to the carrier substrate, wherein each of the pins includes at least one mechanical locking feature located adjacent an end thereof.

7. A semiconductor device assembly, comprising:
at least one semiconductor device package having a plurality of conductors extending from a first exposed surface of the at least one semiconductor device package and at least two apertures extending from the first surface to a second, opposing exposed surface of the at least one semiconductor device package;
a carrier substrate having at least two alignment features thereon spaced and positioned in correspondence to spacing and positioning of the at least two apertures, the at least one semiconductor device package superimposed over the carrier substrate with the at least two apertures aligned with the at least two alignment features; and
structure securing the at least one semiconductor device package to the carrier substrate comprising pins inserted through the at least two apertures and secured to the carrier substrate, wherein the pins are formed of at least one of an antistatic polymer material and an electrically nonconductive material.

8. The semiconductor device assembly of claim 6, wherein the at least one mechanical locking feature further includes a circumferential groove sized and configured to receive a retaining clip therein.

9. The semiconductor device assembly of claim 1, wherein the pins are formed of an antistatic polymer material.

10. The semiconductor device assembly of claim 1, wherein the pins are formed of an electrically nonconductive material.

11. The semiconductor device assembly of claim 1, wherein the plurality of conductors are in temporary contact with the plurality of terminal pads such that electrical communication is established therebetween while each of the plurality of conductors and each of the plurality of terminal pads remain mutually discrete elements.

12. A semiconductor device assembly, comprising:
at least one semiconductor device package having a plurality of conductors extending from a first exposed surface of the at least one semiconductor device package and at least two apertures extending from the first surface to a second, opposing exposed surface of the at least one semiconductor device package;
a carrier substrate having at least two alignment features thereon spaced and positioned in correspondence to spacing and positioning of the at least two apertures, the at least one semiconductor device package superimposed over the carrier substrate with the at least two apertures aligned with the at least two alignment features; and
structure securing the at least one semiconductor device package to the carrier substrate comprising pins inserted through the at least two apertures and secured to the carrier substrate, wherein the pins are thermally bonded to the at least one semiconductor device package.

13. The semiconductor device assembly of claim 6, wherein each of the pins includes a shank portion and wherein the at least one mechanical locking feature includes an enlarged region adjacent the shank portion forming a shoulder therebetween.

14. The semiconductor device assembly of claim 13, wherein the enlarged region further includes a cut dividing the enlarged region into two portions, wherein the cut is located and configured to enable the two portions to compress relative to each other when the enlarged region is inserted through an associated aperture of the at least two apertures.

* * * * *